United States Patent [19]

Baird et al.

[11] Patent Number: 4,654,542
[45] Date of Patent: Mar. 31, 1987

[54] STAIRCASE RAMP VOLTAGE GENERATING APPARATUS WITH ENERGY REUSE

[75] Inventors: Donald H. Baird, Waban; Paul O. Haugsjaa, Acton, both of Mass.

[73] Assignee: GTE Laboratories Incorporated, Waltham, Mass.

[21] Appl. No.: 750,220

[22] Filed: Jul. 1, 1985

[51] Int. Cl.$^4$ .............................................. H03K 4/02
[52] U.S. Cl. ..................................... 307/227; 328/186
[58] Field of Search ................. 377/93, 94, 95, 96, 377/97; 328/186, 14; 307/227, 228

[56] References Cited

U.S. PATENT DOCUMENTS

| | | | |
|---|---|---|---|
| 2,701,303 | 2/1955 | Wells | 328/186 |
| 2,903,604 | 9/1959 | Henle | 328/186 |
| 2,963,579 | 12/1960 | Berry | 377/94 |
| 3,458,721 | 7/1969 | Maynard | 307/227 |
| 3,525,941 | 8/1970 | Smith | 328/186 |
| 3,903,434 | 9/1975 | Rauchenecker | 307/264 |
| 4,204,173 | 5/1980 | Aschwanden | 307/227 |
| 4,404,430 | 9/1983 | Ogita | 328/14 |

Primary Examiner—John S. Heyman
Assistant Examiner—Karl Ohralik
Attorney, Agent, or Firm—David M. Keay

[57] ABSTRACT

Apparatus for repeatedly generating a staircase ramp voltage pulse on a bus connected to a capacitive load employing a set of DC voltage sources, each producing a voltage of a step in the staircase ramp voltage. A storage capacitor is connected between the output terminal of each voltage source and ground. An FET switch is connected between each of the output terminals and the bus and between ground and the bus. A timing circuit closes each of the FET switches in order to produce a staircase ramp voltage on the bus charging the capacitive load. When it is desired to discharge the capacitive load, the timing circuit then closes the switches in reverse order. Each storage capacitor is charged by the discharging capacitive load to a voltage above the voltage of its associated voltage source. The energy thus stored is used during the next cycle to contribute to the energy required to charge the capacitive load on the bus.

5 Claims, 3 Drawing Figures

STAIRCASE RAMP VOLTAGE GENERATING APPARATUS WITH ENERGY REUSE

BACKGROUND OF THE INVENTION

This invention relates to apparatus for generating ramp voltages. More particularly, it is concerned with apparatus for repeatedly providing an ascending and descending staircase ramp voltage to a capacitive load.

Capacitive type displays, such as thin film electroluminescent displays, waste a large portion of the total addressing power simply in the charging and subsequent discharging of elements which are not addressed. Typically in order to minimize charging currents a ramp voltage is applied to row and/or column address buses to charge the buses and their associated capacitive load to the appropriate voltage. The ramp voltage may be produced by selectively connecting an array of voltage sources in sequence to a bus in order to produce a staircase ramp voltage. After the appropriate time interval following the end of the ramp voltage buildup the bus is returned to ground potential. Discharging the charge stored in the capacitive load to ground is a primary cause of power loss in the operation of conventional addressing arrangements.

SUMMARY OF THE INVENTION

Apparatus in accordance with the present invention repeatedly provides an ascending and descending staircase ramp voltage to a capacitive load with improved efficiency. The apparatus comprises a conductive bus adapted to be coupled to a capacitive load. A plurality of voltage source means, each of which has an output terminal, are arranged in order. Each voltage source means except the first in order produces at its output terminal a voltage greater than that of the preceding voltage source means in the order. The apparatus includes an equal plurality of charge storage means, each being coupled to the output terminal of a different one of the voltage source means. Each of an equal plurality of switch means is connected between the output terminal of a different one of the voltage source means and the bus. Timing means are coupled to the plurality of switch means for actuating each of the switch means in order and subsequently in reverse order during each operating cycle of a series of operating cycles. The bus is charged to a voltage approximately equal to the voltage of each voltage source means when the associated switch means is being actuated in order, thereby providing an ascending staircase ramp voltage on the bus as the switch means are actuated in order. The bus discharges to a voltage greater than the voltage of each voltage source means except for the last voltage source means in the order when the associated switch means is being actuated in reverse order, thereby producing a descending staircase ramp voltage on the bus as the switch means are actuated in reverse order.

For a better understanding of the present invention together with other and further objects, advantages, and capabilities thereof, reference is made to the following disclosure and appended claims in connection with the above-described drawings.

DETAILED DESCRIPTION OF THE INVENTION

Figure 1:
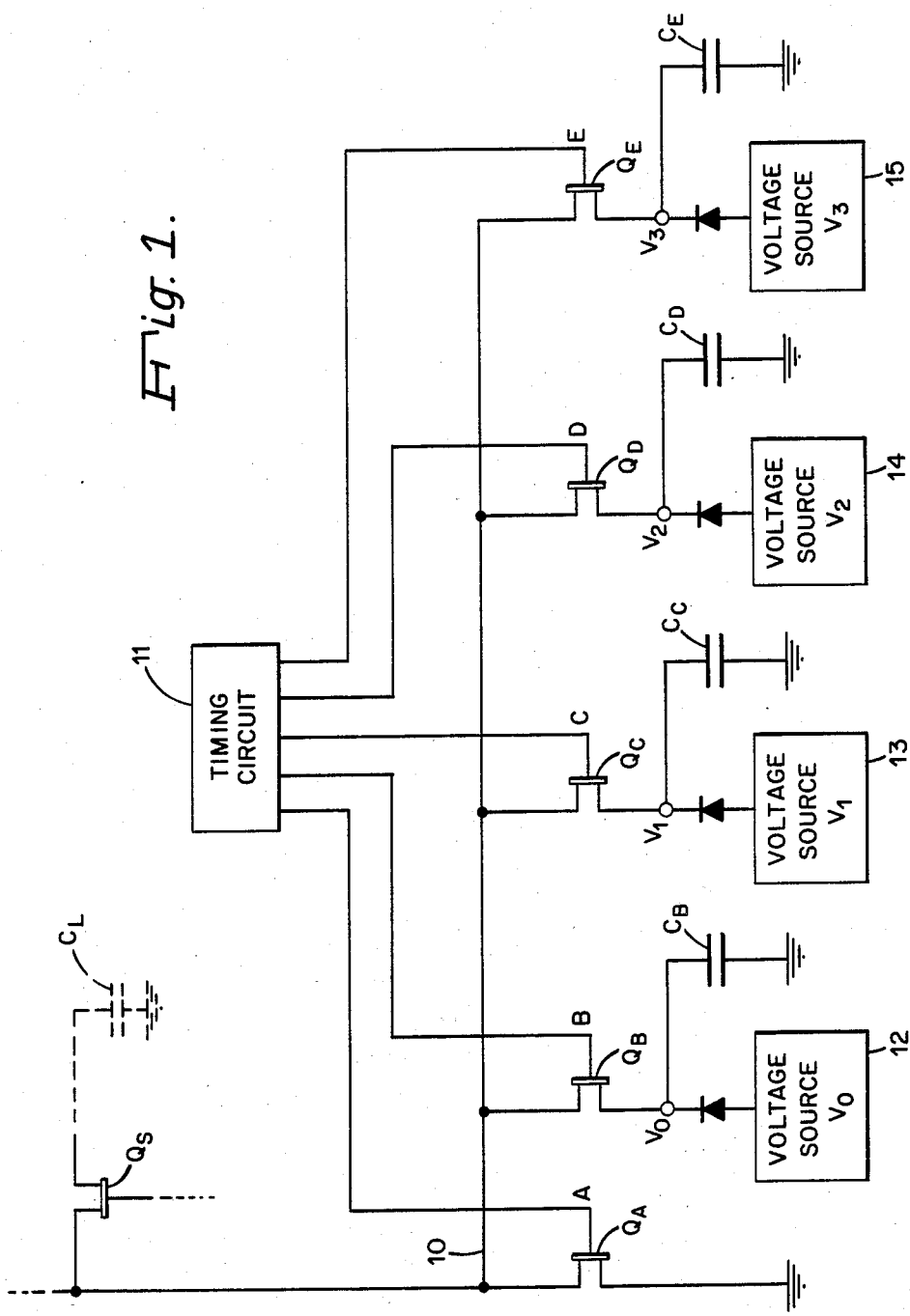
FIG. 1 is a schematic circuit diagram of apparatus in accordance with the present invention for repeatedly providing an ascending and descending staircase ramp voltage to a capacitive load.

FIG. 1 illustrates apparatus for producing an ascending and descending staircase ramp voltage in accordance with the present invention. The apparatus includes a conductive bus 10 which is connected to a capacitive load $C_L$, as indicated in phantom in FIG. 1, by a semiconductor switch or driver $Q_S$. The capacitive load may be provided, for example, by the row and/or column of elements being addressed in a thin film electroluminescent display.

The apparatus includes a set of DC voltage sources 12, 13, 14, and 15 (four being shown for illustrative purposes only), each being connected to an output terminal by way of a diode. The $V_0$, $V_1$, $V_2$, and $V_3$ voltages produced at the output terminals by the voltage sources 12, 13, 14, and 15, respectively, increase in order, preferably in equal increments. The output terminal associated with each of the voltage sources 12, 13, 14, and 15 is connected through a semiconductor switching device, for example FET's $Q_B$, $Q_C$, $Q_D$, and $Q_E$, respectively, to the bus 10. An additional FET $Q_A$ is connected between the bus 10 and ground. The output terminal associated with each of the voltage sources 12, 13, 14, and 15 is connected to ground through a capacitor $C_B$, $C_C$, $C_D$, and $C_E$, respectively, which serves as a charge storage reservoir as will be explained hereinbelow.

Figure 2:
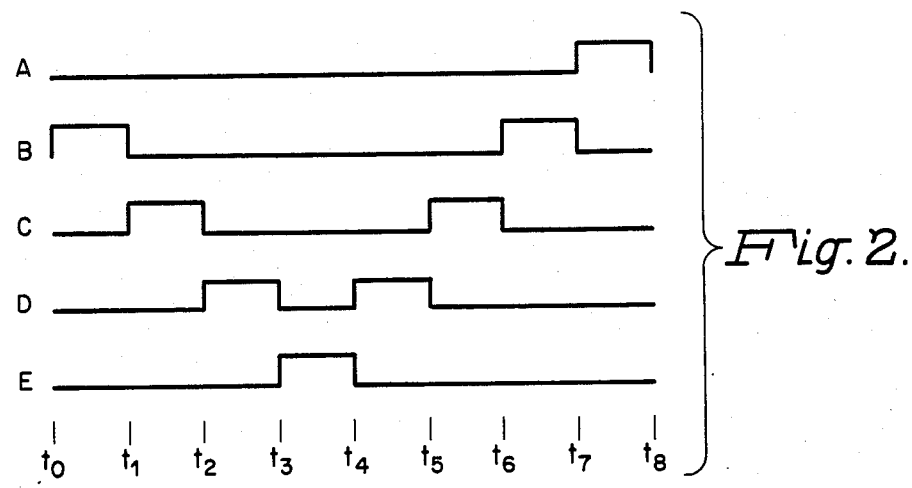
FIG. 2 illustrates the timing signals employed in controlling the operation of the apparatus of FIG. 1.

The gates of each of the FET's $Q_A$, $Q_B$, $Q_C$, $Q_D$, and $Q_E$, labeled A, B, C, D, and E, respectively, are connected to a timing circuit 11 which controls operation of the FET's. FIG. 2 illustrates the control pulses produced by the timing circuit 11 to each of the gates A–E during an operating cycle of the apparatus. For purposes of this discussion, each FET will be assumed to be actuated during a positive-going pulse, providing a closed switch.

Figure 3:
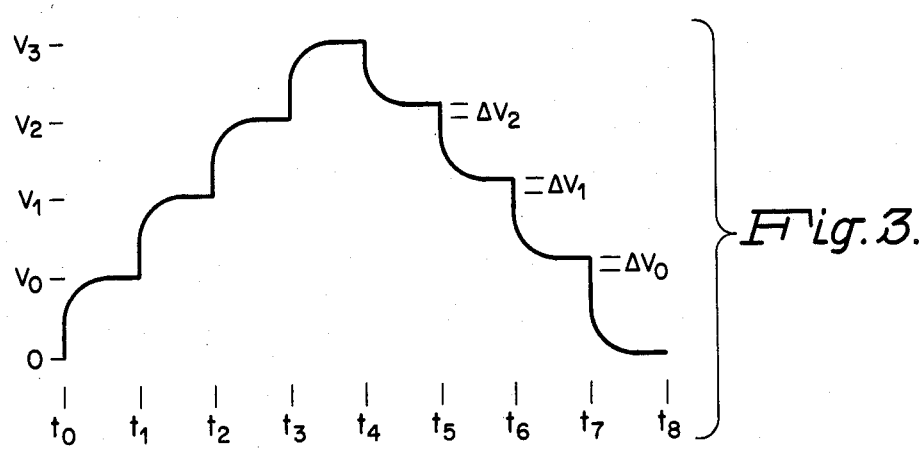
FIG. 3 illustrates the staircase ramp voltage output pulse produced during one operating cycle of the apparatus of FIG. 1.

FIG. 3 illustrates the voltages produced on the bus 10 during an operating cycle of a sequence of control voltages illustrated in FIG. 2, while the bus 10 is connected to a capacitive load $C_L$ as by actuation of a switching FET $Q_S$. In the example shown and described the voltages $V_1$, $V_2$, and $V_3$ increase in increments, in this case each increment being equal to $V_0$, from the preceding voltage in the order, $V_0$ being the first voltage in the order. The capacitors $C_B$, $C_C$, $C_D$, and $C_E$ are charged to the voltage $V_0$, $V_1$, $V_2$, and $V_3$ produced at the output terminals of the voltage sources 12, 13, 14, and 15, respectively.

At time $t_0$ the bus 10 is at ground. Between time $t_0$ and $t_1$ voltage source 12 is connected to the bus 10 by actuating FET $Q_B$. The bus 10 and associated capacitive load $C_L$ are charged to voltage $V_0$. During the period $t_1$ to $t_2$ the timing circuit 11 provides signals whereby the voltage source 13 is connected to the bus 10 and the voltage on the bus increases to voltage $V_1$. During the period $t_2$ to $t_3$ the voltage on the bus 10 increases to $V_2$, and during the period $t_3$ to $t_4$ to $V_3$. Thus, an ascending staircase ramp voltage is produced on the bus 10 charging up the capacitive load $C_L$. As indicated previously, this pulse shape is desirable for addressing the elements in capacitive load apparatus such as electroluminescent displays in order to limit the current through row or column drivers represented by $Q_S$ in this example and thereby control $I^2R$ losses in these devices.

When it is desired to discharge the capacitive load, the switching FET's are actuated in reverse order ($Q_D$, $Q_C$, $Q_B$, and $Q_A$) At time $t_4$ when FET $Q_D$ is actuated, the voltage stored in the capacitive load $C_L$ and consequently the voltage on the bus 10 is $V_3$. This voltage is applied to the capacitor $C_D$ which is connected to the output terminal associated with voltage source 14. During the period $t_4$ to $t_5$ while FET $Q_D$ is actuated, the voltage stored in the capacitive load $C_L$ and on the bus 10 drops from $V_3$ toward the voltage $V_2$ of the voltage source 14. At time $t_5$ the capacitive load $C_L$ has discharged such that the voltage on the bus 10 has dropped to a value of $V_2+\Delta V_2$ as indicated in FIG. 3. This voltage remains stored across capacitor $C_D$.

Similarly, during the period $t_5$ to $t_6$ the voltage on the bus 10 drops from $V_2+\Delta V_2$ to $V_1+\Delta V_1$, as illustrated in FIG. 3, with the capacitor $C_C$ storing a voltage of $V_1+\Delta V_1$. From time $t_6$ to $t_7$ the voltage on the bus 10 drops to $V_0+\Delta V_0$ and a voltage of $V_0+\Delta V_0$ is stored in capacitor $C_B$. During the period $t_7$ to $t_8$ when FET $Q_A$ is actuated, the capacitive load $C_L$ and the bus 10 are discharged to ground.

Thus, the apparatus produces a descending staircase ramp voltage as illustrated in FIG. 3 storing an increment of voltage $\Delta V_i$ above the voltage $V_i$ of its associated voltage source in each of the storage capacitors. As each switching FET is actuated in order during the next operating cycle, the voltage on the associated capacitor drops from $V_i+\Delta V_i$ to $V_i$ as the bus 10 and capacitive load $C_L$ are charged to $V_i$. Thus the energy represented by the incremental voltage $\Delta V_i$ stored during the descending portion of the previous pulse is reused. The incremental voltage $\Delta V_i$ is given by $$\Delta V_i = \frac{C_L(V_{i+1} + \Delta V_{i+1} - V_i)}{C_i + C_L}.$$

The energy stored and reused and, therefore, saved in each storage capacitor $C_i$ during each operating cycle is $C_i(V_i+\frac{1}{2}\Delta V_i)\Delta V_i$. The associated voltage source provides the remainder of the energy required to raise the bus 10 and capacitive load $C_L$ to the appropriate voltage $V_i$ of the step. In the exemplary apparatus shown in FIG. 1 four storage capacitors are shown to provide a four-step staircase ramp pulse. More storage capacitors together with associated circuitry may be employed to increase further the amount of energy saved during each operating cycle while further limiting maximum values of current through driver $Q_S$. The costs involved in increasing the complexity of the apparatus must be balanced against the improvement in current peaks and in energy savings to determine the optimum number of storage capacitors for each particular situation.

While there has been shown and described what is considered a preferred embodiment of the present invention, it will be obvious to those skilled in the art that various changes and modifications may be made therein without departing from the invention as defined by the appended claims.

What is claimed is:

1. Apparatus for repeatedly providing an ascending and descending staircase ramp voltage to a capacitive load comprising a conductive bus adapted to be coupled to a capacitive load;

a plurality of voltage source means arranged in order, each voltage source means having an output terminal, each voltage source means except the first in order producing at its output terminal a voltage greater than that of the preceding voltage source means in the order, and each voltage source means including means connected to its output terminal for providing a low impedance to current flow from the voltage source means to the bus and for providing a high impedance to current flow from the bus to the voltage source means;

an equal plurality of charge storage means, each being coupled to the output terminal of a different one of said voltage source means;

an equal plurality of switch means, each being connected between an output terminal of a different one of said voltage source means and said bus; and timing means coupled to said plurality of switch means for actuating each of said plurality of switch means in order by closing each for a predetermined time interval and subsequently in reverse order during each operating cycle of a series of operating cycles whereby the bus is charged to a voltage approximately equal to the voltage of each voltage source means when the associated switch means is being actuated in order, thereby producing an ascending staircase ramp voltage on the bus as the switch means are actuated in order; and whereby the bus discharges to a voltage greater than the voltage of each voltage source means except the last voltage source means in the order when the associated switch means is being actuated in reverse order, thereby producing a descending staircase ramp voltage on the bus as the switch means are actuated in reverse order.

2. Apparatus in accordance with claim 1 wherein each of said charge storage means is a capacitor connected between the output terminal of the associated voltage source means and a common reference potential.

3. Apparatus in accordance with claim 1 wherein
each of said charge storage means is connected between the output terminal of the associated voltage source means and a common reference potential; and including
an additional switch means connected between said common reference potential and said bus;
said timing means being coupled to said additional switch means and being operable to actuate said additional switch means subsequent to actuating each of said plurality of switch means in reverse order during each operating cycle of a series of operating cycles
whereby the bus is at the voltage of the common reference potential at the end and at the start of each operating cycle.

4. Apparatus in accordance with claim 3 wherein
said common reference potential is ground; and
the voltage at the output terminal of the first voltage source means is a predetermined value of voltage above ground; and
the voltage at the output terminal of each voltage source means except the first in order is greater than that of the preceding voltage source means in the order by said predetermined value of voltage.

5. Apparatus in accordance with claim 4 wherein each of said charge storage means is a capacitor; and each of said switch means is a semiconductor switching device.

* * * * *